United States Patent [19]

Carruthers et al.

[11] 4,284,663

[45] Aug. 18, 1981

[54] FABRICATION OF OPTICAL WAVEGUIDES BY INDIFFUSION OF METALS

[75] Inventors: John R. Carruthers, Murray Hill; Ivan P. Kaminow, New Shrewsbury; Ronald V. Schmidt, Matawan, all of N.J.

[73] Assignee: Bell Telephone Laboratories, Incorporated, Murray Hill, N.J.

[21] Appl. No.: 104,676

[22] Filed: Dec. 17, 1979

Related U.S. Application Data

[63] Continuation of Ser. No. 684,974, May 10, 1976, abandoned, which is a continuation of Ser. No. 477,165, Jun. 6, 1974, abandoned.

[51] Int. Cl.³ .............................................. B05D 5/06
[52] U.S. Cl. .................................... 427/164; 65/30 E; 350/96.3; 427/250; 427/255; 427/282; 427/383.3; 29/458
[58] Field of Search ............... 427/164, 166, 282, 124, 427/250, 255, 383.3, 163; 350/96 WG; 65/30

[56] References Cited

U.S. PATENT DOCUMENTS

| | | | |
|---|---|---|---|
| 2,392,429 | 1/1946 | Sykes | 427/124 |
| 2,856,313 | 10/1958 | Gerber | 427/124 |
| 3,271,179 | 9/1966 | Smith | 427/166 |
| 3,434,774 | 3/1969 | Miller | 350/96 WG |
| 3,446,603 | 5/1969 | Loiacono et al. | 23/305 RE |
| 3,837,827 | 9/1974 | Carruthers et al. | 350/96 WG |
| 3,850,688 | 11/1974 | Halt | 427/124 |

*Primary Examiner*—Ronald H. Smith
*Assistant Examiner*—Janyce A. Bell
*Attorney, Agent, or Firm*—Richard D. Laumann; Wilford L. Wisner

[57] ABSTRACT

There is disclosed a method of fabricating an optical waveguiding surface layer in an optically transparent crystalline substrate, such as lithium niobate, by selectively indiffusing metal ions, such as titanium, into the crystal to effect an increase in the index of refraction of a surface portion thereof. The indiffused metal ions serve to raise both the ordinary and extraordinary refractive indices of the substrate by amounts which are of the order of one percent at the diffusion surface and which gradually decrease by one-half at depths of the order of one micrometer below the surface. By properly adjusting the relevant diffusion parameters in the method, the important surface waveguide characteristics can be independently controlled.

7 Claims, 5 Drawing Figures

FABRICATION OF OPTICAL WAVEGUIDES BY INDIFFUSION OF METALS

This application is a continuation of application Ser. No. 684,974, filed May 10, 1976 and now abandoned, which was a continuation of application Ser. No. 477,165, filed on June 6, 1974, and now abandoned.

BACKGROUND OF THE INVENTION

This invention relates to a method of fabricating optical waveguiding devices, such as those used in optical communication systems.

Much recent work has been directed toward the fabrication of optical circuit devices for use in future optical communication systems and other optical apparatus. See, for example, Volume QE-8 of the *IEEE Journal of Quantum Electronics,* page 199 (1972). The basic building blocks of such devices are dielectric waveguides, which consist of an optically transparent waveguiding region surrounded by media of lower indices of refraction. One can distinguish in the art between two fundamental classes of approaches to the fabrication of these waveguides.

In the first class, optical waveguides are typically formed by selectively applying a layer of a dielectric material onto a substrate of lower refractive index. In this class are found techniques such as that described in Volume 48 of the *Bell System Technical Journal,* page 3445 (1969), wherein high optical quality waveguides are fabricated by sputtering of optical glasses through a mask onto lower index glass substrates. Epitaxial growth techniques, such as that described in Volume 21 of *Applied Physics Letters,* page 358 (1972), have been found attractive for the growth of high quality single crystalline guiding layers on lower index crystalline substrates. Each of these approaches is relatively simple and well suited for the inexpensive mass production of the desired devices. However, the devices fabricated according to these techniques are characterized by sharp, step-like transitions of refractive index between the different dielectric materials. This fact, combined with the presence of any roughness or irregularities in the material interfaces, can give rise to undesirably high scattering losses for guided optical waves.

In the second class of fundamental approaches, waveguides are typically formed by selectively altering the index of refraction of a bulk transparent sample. Here one finds techniques such as the ion bombardment technique described in Volume 11 of *Applied Optics,* page 1313 (1972), wherein selected regions of increased refractive index are provided by selectively generating molecular disorder in a bulk sample. Also in this class are techniques in which selected regions of changed index of refraction are induced either by diffusing an index changing diffusant into a transparent sample, as described in Volume 21 of *Applied Physics Letters,* page 325 (1972), or by effusing (i.e., outdiffusing) selected chemical constituents from bulk samples to effect a change in index, as described in the article by two of us (Carruthers and Kaminow), in Volume 22 of *Applied Physics Letters,* page 326 (1973). In each of these approaches, the index transitions in the guides are smooth and gradual, rather than sharp. This fact eliminates, for the most part, the imperfect dielectric interfaces responsible for high scattering losses in waveguides of the first class, and thus makes the waveguides of the second class generally more desirable. Nevertheless, each of these approaches has been found to have inherent weaknesses. For example, in the ion bombardment technique, a trade-off is typically required between large index changes on the one hand, and low bulk scattering losses and high resolution on the other. The diffusion techniques have to date been shown to be useful only with a limited class of diffusant and host materials. Finally, the guides produced by the outdiffusion technique have been hampered to date by relatively low index changes spread over relatively large sample thicknesses.

SUMMARY OF THE INVENTION

Our present invention is based upon the discovery that it is possible to indiffuse certain metal ions into optically transparent crystalline substrate materials, such as lithium niobate, to effect an increase in the index of refraction of a surface portion thereof.

In accordance with our invention, positive index optical waveguiding surface layers are fabricated by the indiffusion into an optical crystal of a metal selected from the group consisting of the transition element metals having an atomic number of 21 through 30 inclusive, as well as silver and gold. Exemplary of the class of materials useful in our method is titanium which, when diffused into lithium niobate, has been found to produce excellent optical waveguides. Preliminary experimental indications are that such guiding structures should enable the construction of a wide variety of electro-optic or acousto-optic devices which modulate, switch, or otherwise manipulate guided optical waves. Such devices are potentially useful in future optical communication systems, optical memories and data processing apparatus, and other optical systems.

In an illustrative method of our invention, a thin layer of a metal, such as titanium, is deposited, illustratively by evaporation, onto a polished face of a lithium niobate crystal. The sample is then heated in an environment which prevents oxidation of the metal to temperatures in the range of about 800° C. to 1100° C. The sample is held at the elevated temperature for a period of time sufficient to cause all, or substantially all, of the metal to diffuse into the substrate lattice. The relevant parameters in the method are initial metal layer thickness, diffusion temperature and time, and the selection of these parameters determines the refractive index profile that is produced in the sample. For sufficiently long diffusion times, all of the thin layer of metal has been found to disappear from the surface into the substrate. The diffused metal serves to raise both the ordinary and extraordinary indices of refraction of the substrate by amounts which are the order of one percent at the diffusion surface and which gradually decrease by one-half at depths of the order of one micrometer below the surface.

Advantageously, the method of our invention can be carried out at temperatures below the Curie temperature of the substrate. As is well known, ferroelectric crystals such as lithium niobate become depoled when heated to temperatures above the Curie point. The method of the invention is thus relatively simple in that it does not require repoling of the substrate. Another important advantage of the invention is that strip waveguides can be readily formed in the substrate by suitably masking the surface of the substrate during deposition of the metal layer.

BRIEF DESCRIPTION OF THE DRAWING

A more complete understanding of the foregoing and other features and advantages of our invention can be obtained from the following detailed description taken in conjunction with the accompanying drawing in which.

DETAILED DESCRIPTION

1. Processing

Figure 1A:
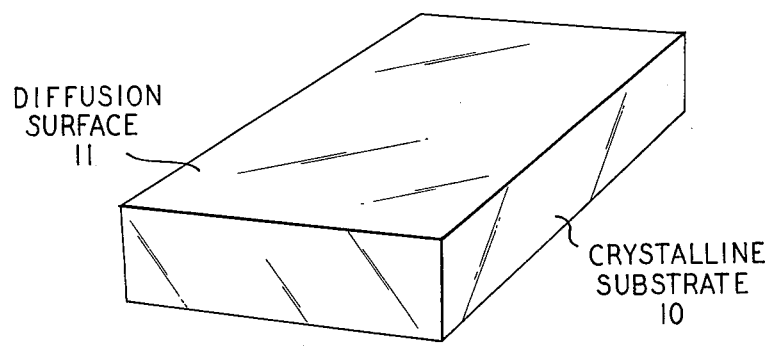
FIGS. 1A through 1C are perspective views of a crystalline substrate at various stages of fabrication according to the method of the invention.

FIG. 1A shows a crystalline substrate 10 having a substantially smooth and flat major surface 11 into which transition metal ions are to be diffused according to the invention. Substrate 10 is illustratively a single crystalline, optically transparent material such as lithium niobate ($LiNbO_3$). As indicated above, $LiNbO_3$ is an important material for active optical devices because of its useful electro-optic and acousto-optic coefficients. Consistent with conventional usage, "optically" transparent materials include materials which are substantially pervious to visible, as well as near-visible (particularly infrared), portions of the electromagnetic spectrum. In general, crystals having regions of transparency in the range of about 0.1 micrometers ($\mu m$) to 10.0 $\mu m$ in wavelength are suitable for the invention.

Diffusion surface 11 of substrate 10 is preferably smooth and flat to within a small fraction (e.g., 1/50th) of the wavelength of the optical radiation to be propagated in the desired device. Since surface 11 forms an interface in the desired waveguide, it is important that it be smooth to avoid excessive scattering losses in the guided wave. The desired smoothness in surface 11 can be provided simply by manual polishing, or by any of the other well-known crystal polishing techniques.

The particular crystalline surface 11 of substrate 10 that is selected for indiffusion does not appear to be critical in the invention. For example, with $LiNbO_3$, both the (010) and (001) crystalline faces have been used as diffusion surfaces for diffusion perpendicular and parallel, respectively, to the c-axis of the crystal.

Figure 1B:
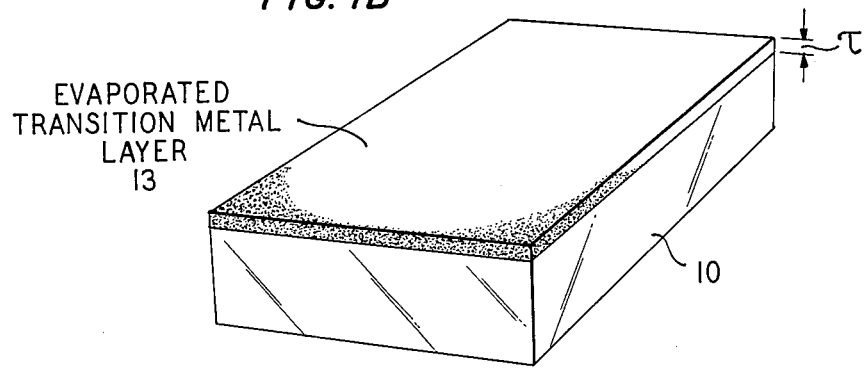

FIG. 1B illustrates substrate 110 at the second stage of fabrication according to the invention. There has been deposited a thin layer 13 of a metal on diffusion surface 11. As noted previously, the metals useful as diffusants in the invention are selected from the group consisting of the transition element metals having an atomic number of 21 through 30 inclusive, as well as silver and gold. These metals are listed in Table I, along with their atomic numbers. The transition metals are known to produce d-electron bonds that are polarizable in the visible portion of the electromagnetic spectrum. It is tentatively believed that the refractive index increases in the crystals fabricated according to the invention are primarily due to the increase in polarizability provided by the valence electrons of the induffused metals. For example, titanium (Ti), vanadium (V), and nickel (Ni) have two, three and eight electrons, respectively, in the unfilled d-shells. The increases in refractive index observed as the result of the indiffusion of silver (Ag) and gold (Au) are also believed to result primarily from the increases in polarizability provided by their valence electrons.

Metal layer 13 may be deposited on diffusion surface 11 using any conventional metal deposition apparatus. For example, an evacuated evaporation chamber can be used in which substrate 10 is disposed, and in which a sample of the metal is heated to a temperature which causes it to evaporate and to deposit on the substrate. Since the thickness $\tau$ of a metal layer 13 is a relevant parameter in determining the index profile resulting in the crystal, the deposition apparatus illustratively includes means for monitoring the thickness of the deposited layer. Such monitoring means can be provided simply by including a quartz crystal near substrate 10 in the evaporation chamber. The frequency of the oscillations of the quartz crystal vary according to the thickness of the metal that is deposited thereon. Thus, by monitoring the frequency of the oscillations from the quartz crystal, a suitable indication of the metal layer thickness on substrate 10 is provided.

As an alternative to evaporation, metal layer 13 could also be sputtered on substrate 10. In either case, the metal layer thickness $\tau$ is preferably in the range of about 200 angstrom units (Å) to about 800 Å.

Figure 2:
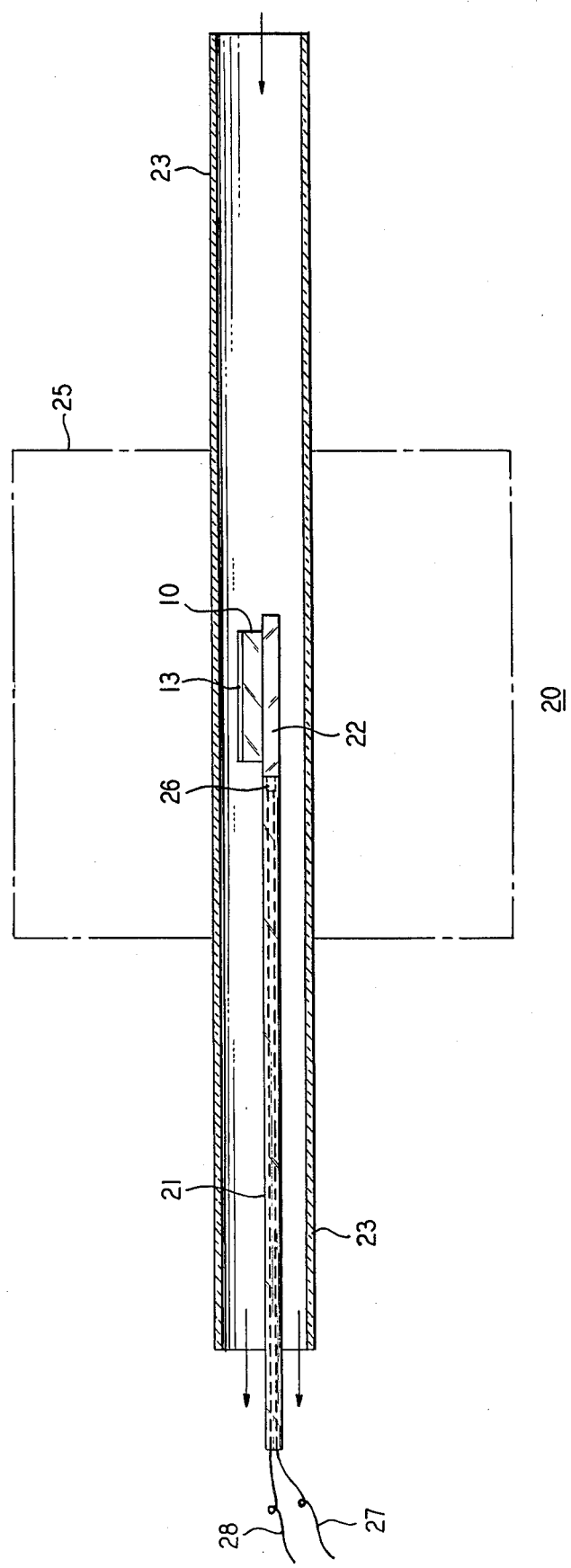
FIG. 2 is a partially pictorial, partially schematic illustration of apparatus for heating the crystalline substrate to cause the metal indiffusion.

In the next, and final, stage of fabrication according to the invention, substrate 10 including metal layer 13 is heated to cause the indiffusion of the metal ions into the substrate crystalline lattice. FIG. 2 of the drawing illustrates apparatus that may be used for this purpose. Illustratively, the heating apparatus 20 of FIG. 2 includes a relatively small diameter alumina tube 21 which is joined to an alumina plate 22 upon which the sample is disposed. The tube 21-plate 22 assembly is inserted inside a larger diameter alumina tube 23. The area 25, delineated by the broken line in the figure, represents an oven or other suitable heating apparatus. Thermocouple 26 is inserted in tube 21 and situated in close proximity to the sample. Leads 27 and 28 of thermocouple 26 are connected to means (not shown) for monitoring the temperature of the sample.

With the apparatus of FIG. 2, substrate 10 is heated to a temperature T in the range of about 800° C. to 1100° C. The atmosphere inside of tube 23 is inert so as to prevent oxidation of the metal of layer 13 during heating. Such an inert atmosphere can be provided by flowing argon, or any other nonreactive gas, through tube 23, illustratively in the direction indicated by the arrows shown in the figure. The diffusion time t is measured from the point at which the desired elevated temperature is reached in heating apparatus 20. Typically, diffusion times t of about four to eight hours are required to cause all, or substantially all, of the metal of layer 13 to diffuse into substrate 10. After time t, the argon is illustratively disconnected from tube 23, flowing oxygen is illustratively admitted to tube 23 to reoxidize substrate 10, and oven 25 is switched OFF. For a sufficiently long diffusion time t and a sufficiently small metal layer thickness $\tau$, all of the metal of layer 13 disappears from surface 11 into substrate 10. If the diffusion is stopped before all of the metal enters the substrate, the readmitted oxygen causes an oxide residue to form on the surface which can be removed after cooling by lightly hand-polishing the sample. A structure of the form illustrated in FIG. 1C of the drawing results, in which a thin indiffused layer 15 has been formed in a surface portion of substrate 10.

2. Theory

The functional form of the concentration profiles resulting from the diffusion of atoms into a solid have been represented and analyzed mathematically in a number of prior works. See, for example, P. G. Shewmon, *Diffusion in Solids*, McGraw Hill, N.Y., (1963). In general, for a diffusion time t long compared to the time required for the diffusant completely to enter the solid, the concentration profile approaches a Gaussian function of the form $$c_1(x,t) = \frac{a\tau}{1\sqrt{\pi Dt}} \exp(-x^2/4Dt) \quad (1)$$

where x is the depth below the diffusion surface in the solid, $\alpha$ is the density of the deposited metal layer, and D is the diffusion constant, which is given by $$D = D_o \exp(-T_o/T) \quad (2)$$

where $D_o$ and $T_o$ are constants and T is the diffusion temperature. For a diffusion time t which is short compared to the time required for the diffusant completely to enter the solid, the concentration profile is best represented by a complementary error function (erfc) of the form $$c_2(x,t) = c(0,0) \, \text{erfc}(x/2\sqrt{Dt}). \quad (3)$$

where c(0,0) is the metal diffusant concentration at the diffusion surface at t=0. For a diffusion time t comparable to the time required for all of the diffusant to enter the solid, the concentration profile will be intermediate to the Gaussian and erfc profiles of Equations (1) and (3) above.

It is reasonable to assume that the refractive index change $\Delta n(x)$ resulting from the presence of the diffusants in the crystal is proportional to c(x) for small diffusant concentrations. Thus, if a is taken as the index change at the diffusion surface (i.e., a=$\Delta n$(o)) and b is taken as the characteristic depth of the diffused layer (i.e., $b = 2\sqrt{Dt}$), then the index profiles corresponding to the concentration profiles of Equations (1) and (3) above are, respectively, $$\Delta n_1(s) = a_1 \exp(-x^2/b_1^2) \quad (4)$$

and $$\Delta n_2(x) = a_2 \text{erfc}(x/b_2) \quad (5)$$

Taking Equation (4) as an example, an approximate expression for a, the index change at the diffusion surface, can be derived for small $\Delta n$ as follows:

$$a \equiv \Delta n(0) \cong (2/\sqrt{\pi})(dn/dc(\tau/b)\alpha. \quad (6)$$

It is clear from Equation (6) that the index change a at the diffusion surface can be controlled by adjusting $\tau$, the diffusant layer thickness, as well as by choosing diffusants with desirable values of dn/dc. As indicated by Equation (2) above, the characteristic diffusion depth b, which is equal to $2\sqrt{Dt}$, can be controlled by adjusting the parameters t and T. Accordingly, the important characteristic of the optical waveguiding surface layer (i.e., a and b) can be separately controlled according to the invention simply by adjusting the relevant parameters $\tau$, t and T during fabrication.

By analogy to the theory of optical wave propagation in a slab or an exponential index waveguide (see, for example, D. Marcuse, *Theory of Dielectric Optical Waveguides*, Academic Press, N.Y., (1974), particularly page 16 thereof) the number of modes M that can propagate in an indiffused surface layer having an index change a at the diffusion surface and a characteristic layer thickness b should be proportional to $$M \sim (b/\lambda)(na)^{\frac{1}{2}} \sim (n\tau b)^{\frac{1}{2}}/\lambda, \quad (7)$$

where $\lambda$ is the free space wavelength of the optical wave and n is the mean index of refraction of the layer. It is thus apparent from Equation (7) that the indiffused surface layers can be made to propagate only a single mode of an optical wave if the ratio b/a, and thus the characteristic layer thickness b, is sufficiently small.

3. Experimental Results

Figure 1C:
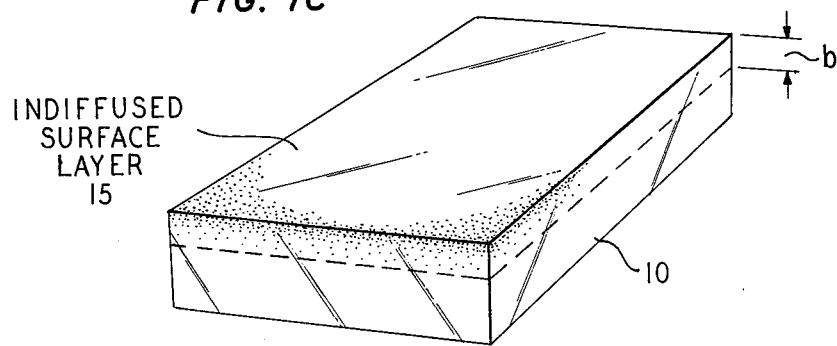

A variety of structures such as that illustrated in FIG. 1C were fabricated according to the invention by indiffusing various metals into LiNbO$_3$ single crystals. Observations of the refractive index profiles were made using a Leitz interference microscope. These observations indicated that the presence of the indiffused metal ions served to raise both the ordinary ($n_o$) and extraordinary ($n_e$) indices of the substrate in surface layers of about 1.0 $\mu$m to about 50.0 $\mu$m in thickness. The resulting structures thus appeared ideally suited for the guidance of optical waves in both the TE and TM polarization modes.

Figure 3:
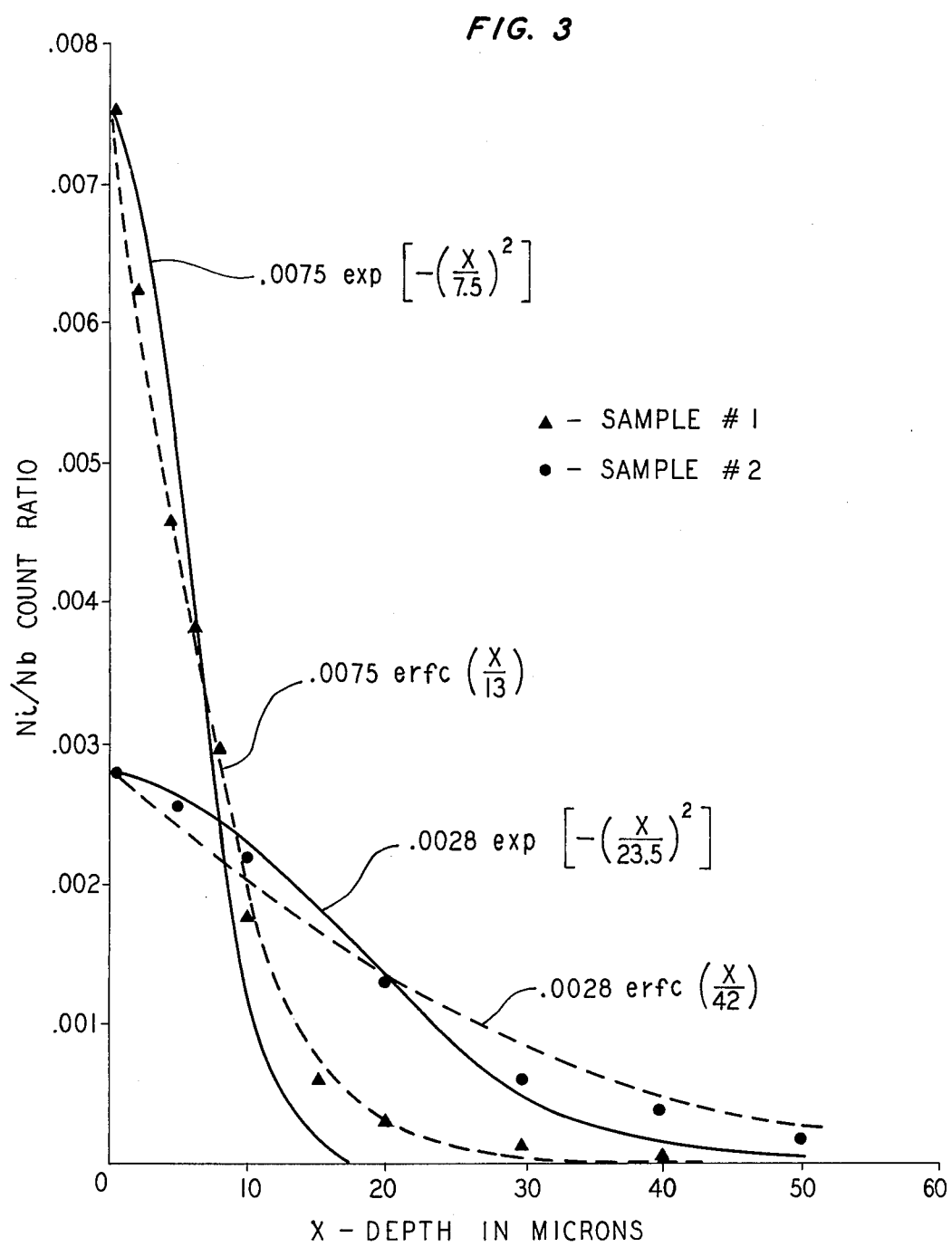
FIG. 3 is a plot of the relative metal concentration as a function of distance below the surface of two indiffused samples fabricated according to the method of the invention.

Since most of the surface layers fabricated according to the invention were too thin to permit direct measurement of the functional form of the index profile, electron microprobe measurements were made to determine the relative metal concentration profiles for two relatively thick Ni-diffused surface layers in LiNbO$_3$. FIG. 3 of the drawing illustrates a plot of the measured Ni/Nb count ratios received from the microprobe as a function of the depth below the surface of the two samples. In both samples, the Ni was diffused according to the method described above perpendicular to the c-axis of the substrate. The triangular data points in FIG. 3 correspond to sample #1 which is a Ni-diffused film having the relevant parameters $\tau$=400 Å, t=6 hours, and T=850° C. The circular data points in FIG. 3 correspond to sample #2 which is a Ni-diffused film having the relevant parameters $\tau$=400 Å, t=6 hours, and T=950° C. The actual Ni/Nb concentration ratio is proportional to the measured count ratio with a proportionality factor greater than unity. The data in FIG. 3 were obtained by probing points in the crystal on a plane normal to the plane of the diffusion surface.

The Gaussian and erfc concentration profiles of Equations (1) and (3) above were numerically fitted to the measured data points for the two samples. The concentration profile of sample #1 was found to be well described by the erfc function of Equation (3) (dotted lines in FIG. 3). The concentration profile of sample #2 on the other hand was better described by the Gaussian profile of Equation (1) (solid lines in FIG. 3). Although in the fabrication of both samples, the metal layer appeared to diffuse completely into the crystal, the curves of FIG. 3 clearly demonstrate the strong dependence of the diffusion rate, and the diffusion depth b, on temperature.

Several metal-indiffused structures were experimentally examined by coupling an optical wave from a helium-neon laser ($\lambda = 0.6328$ $\mu$m) into the positive index surface layers using a prism coupler (see Volume 14 of *Applied Physics Letters*, page 291 (1969)). A number of modes M and their corresponding prism coupling angles were measured and, from these measurements, the diffusion depth b and the index change at the diffusion surface a were crudely estimated by comparing the effective indices of the modes with those expected for an exponential index slab waveguide. The average results of these calculations for several Ti-, V- and Ni-diffused samples are given in Table II. It should be emphasized that since the form of index profile in the experimental layers was not exponential, all of the effective mode indices in an experimental multimode waveguides could not be made to coincide with those of an exponential waveguide for any set of a,b parameters. The highest and lowest order modes were matched for the estimates of Table II and it was assumed that b is approximately the same for TE and TM modes.

It will be noted from Table II that a is as large as a few percent, and b is as small as one $\mu$m for the Ti-diffused waveguides. The diffusion depths b are larger and the index changes a are smaller for Ni and V than for Ti for a given t and T. However, reducing t and/or T should bring a and b for the Ni- and V-diffused samples more into line with the values for the Ti-diffused samples. The change in refractive index with concentration, dn/dc, may be calculated using the data of Table I, Equation (6) above, and the standard densities of the particular metal diffusants employed in the experiments.

The dominant sources of loss in the waveguides were found to be scattering from crystal surface imperfections, and, possibly, absorption by the metal ions. In each case, however, the losses at 0.6328 $\mu$m are estimated to be less than one dB per centimeter.

Various modifications of the method described illustratively hereinabove will be realized by those skilled in the art without departing from the scope of the invention, as defined by the appended claims. For example, although lithium niobate has been found to be a preferred material for use with the method of the invention, it is not intended to suggest that the invention is limited to use with that material. Preliminary indications are that it is possible to fabricate positive index surface layers in such materials as the sillenite bismuth oxides (e.g., bismuth germanate), the synthetic garnets (e.g., yttrium iron garnet), lithium tantalate, and lead molybdate by the metal indiffusion method of the invention. It is also possible that other diffusants, such as one or more of the rare earth elements (e.g., neodymium, gadolinium, etc.) will be found to produce useful optical waveguiding layers by the method of the invention.

Additionally, the method of the invention can be used to fabricate strip optical waveguides which have a transverse dimension comparable to their thickness by appropriately masking the diffusion surface of substrate 10 prior to the deposition of the metal layer thereon. The use of electron resist materials such as poly(methyl methacrylate) allow thin strip waveguides to be fabricated in intricate patterns utilizing a high resolution electron beam to expose the resist.

TABLE I

| METAL DIFFUSANTS | |
| --- | --- |
| Metal | Atomic Number |
| scandium (Sc) | 21 |
| titanium (Ti) | 22 |
| vanadium (V) | 23 |
| chromium (Cr) | 24 |
| manganese (Mn) | 25 |
| iron (Fe) | 26 |
| cobalt (Co) | 27 |
| nickel (Ni) | 28 |
| copper (Cu) | 29 |
| zinc (Zn) | 30 |
| silver (Ag) | 47 |
| gold (Au) | 79 |

TABLE II

| | | | | TYPICAL DATA FOR METAL-DIFFUSED GUIDES | | | | |
| --- | --- | --- | --- | --- | --- | --- | --- | --- |
| METAL | THICK $\tau$-A | TIME t-hrs | TEMP. T-°C. | DIFF. DIR. WITH RESPECT to C-Axis | NO. of MODES-M | EFF. b-$\mu$m | EFF. $\Delta n_o(O)$ | EFF. $\Delta n_e(O)$ |
| Ti | 500 | 6 | 960 | $\perp$ | 1 TM | 1.1 | 0.01 | — |
| | | | | $\perp$ | 4 TE | 1.1 | — | 0.04 |
| Ti | 500 | 6 | 960 | $\parallel$ | 1 TE | 1.6 | 0.006 | — |
| | | | | $\parallel$ | 5 TM | 1.6 | — | 0.025 |
| V | 250 | 6 | 950 | $\perp$ | 1 TM | 6.5 | 0.0005 | — |
| | | | | $\perp$ | 4 TE | 6.5 | — | 0.002 |
| V | 500 | 6 | 970 | $\perp$ | 1 TM | 6.2 | 0.0005 | — |
| | | | | $\perp$ | 4 TE | 6.2 | — | 0.004 |
| Ni | 270 | 6 | 800 | $\perp$ | 2 TM | 2.9 | 0.007 | — |
| | | | | $\perp$ | 2 TE | 2.9 | — | 0.004 |
| Ni | 270 | 6 | 800 | $\parallel$ | 2 TE | 2.6 | 0.007 | — |
| | | | | $\parallel$ | 2 TM | 2.6 | — | 0.006 |
| Ni | 270 | 6 | 960 | $\perp$ | 3 TM | 6.6 | 0.002 | — |
| | | | | $\perp$ | 0 TE | 6.6 | — | — |
| Ni | 270 | 6 | 960 | $\parallel$ | 2 TE | 5.5 | 0.0015 | — |
| | | | | $\parallel$ | 0 TM | 5.5 | — | — |
| Ni | 500 | 6 | 800 | $\perp$ | 3 TM | 2.8 | 0.0095 | — |
| | | | | $\perp$ | 2 TE | 2.8 | — | 0.006 |
| Ni | 500 | 6 | 800 | $\parallel$ | 3 TE | 3.1 | 0.0085 | — |
| | | | | $\parallel$ | 2 TM | 3.1 | — | 0.0045 |
| Ni | 500 | 6 | 960 | $\perp$ | 7 TM | 11.6 | 0.0025 | — |
| | | | | $\perp$ | 0 TE | 11.6 | — | — |
| Ni | 500 | 6 | 960 | $\parallel$ | 4 TE | 4.5 | 0.0045 | — |
| | | | | $\parallel$ | 0 TM | 4.5 | — | — |

What is claimed is:

1. A method of fabricating a light guide along a surface of a crystal transparent to at least a portion of the optical spectrum comprising the steps of providing a path of increased index of refraction along said surface, said path forming a light guide; and providing means for coupling an optical wave into said light guide; characterized in that said step of providing a path of increased index includes the step of depositing a layer of a diffusant selected from the group consisting of elements having atomic numbers 21–30, gold and silver onto said surface of said crystal, said layer having a thickness in the range of about 200 Angstroms to about 800 Angstroms and indiffusing said diffusant by heating said crystal to a temperature in the range of about 800 degrees C. to 1100 degrees C. for a time between four hours and eight hours, said time being sufficient to effect an increase in the index of refraction of a surface layer of said crystal suitable for guiding an optical wave, said increase being of the order of one percent at said surface and which decreases by one-half at a depth of the order of one micrometer below said surface.

2. The method of claim 1 in which said crystal is a lithium containing oxide material.

3. The method of claim 2 in which said crystal is lithium niobate.

4. The method of claim 3 in which said diffusant is selected from the group consisting of titanium, vanadium and nickel.

5. The method of claim 1 in which said diffusant is diffused into selected regions of said surface layer so as to produce a pattern.

6. The method of claim 5 wherein said depositing step places said diffusant on selected regions of said surface layer.

7. The method of claim 6 wherein said selected regions are defined by a mask.

* * * * *